June 20, 1967 A. J. GRUODIS 3,327,130

TUNNEL DIODE POLARITY INVERTER

Filed Sept. 15, 1960

INVENTOR
ALGIRDAS J. GRUODIS
BY
Joseph C Redmond Jr.
ATTORNEY

United States Patent Office 3,327,130

Patented June 20, 1967

3,327,130

TUNNEL DIODE POLARITY INVERTER

Algirdas J. Gruodis, Hyde Park, N.Y., assignor to International Business Machines Corporation, New York, N.Y., a corporation of New York Filed Sept. 15, 1960, Ser. No. 56,160
15 Claims. (Cl. 307—88.5)

This invention relates to polarity inverter circuits and more particularly to polarity inverter circuits employing bistable semi-conductor devices.

Polarity inverter circuits are well known wherein vacuum tubes and semi-conductor devices having monostable operating points are employed as the active elements of the circuits. Such active elements imposed limitations on the output of inverter circuits with respect to speed, frequency and pulse shape. Recently a bistable semi-conductor device has been developed, the characteristics of which offer improved performance for inverter circuits with respect to speed, pulse shape and input signal requirements. Inverter circuits, however, employing bistable semi-conductor devices, can be unduly complicated for bipolar operation. Also resetting is required between the stable states which further complicates such circuits.

A general object of the present invention is an improved inverter circuit which is rapid in operation and provides bipolar operation about a reference level.

One object is a simplified inverter circuit employing bistable semi-conductor devices which provides output pulses substantially rectangular in shape.

Another object is a bipolar inverter circuit employing bistable semi-conductor devices which do not require resetting between stable states.

Still another object is a high speed bipolar inverter circuit employing bistable semi-conductor devices, the output signal of such circuit being relatively large with respect to an input signal.

In an illustrative embodiment, the present invention comprises at least two bistable semi-conductor devices having a common junction and connected between the ends of a power supply of suitable magnitude. Circuit means are adapted to bias the semi-conductor devices into one of their stable states. Connected across the semi-conductor devices is an input circuit for receiving input signals. An output circuit is connected to the common junction of the semi-conductor devices, whereby output signals are of opposite to and of a greater magnitude than that of an input pulse.

One feature of the present invention is the connection of the input circuit and the power supply to the bistable semi-conductor devices to obtain large signal output with respect to the signal input.

Another feature is circuit means for biasing the bistable semi-conductor devices to obtain operation thereof between stable states for successive input pulses without reset of the devices between the pulses.

Still another feature is the interconnection of the semi-conductor devices and the output circuit to obtain output signals which are substantially rectangular in shape and of reverse polarity to any input signals supplied to the devices.

The foregoing and other objects and features of the invention will be apparent from the following more particular description of preferred embodiments of the invention as illustrated in the accompanying drawings.

Figures 1, 2, 4, 5:
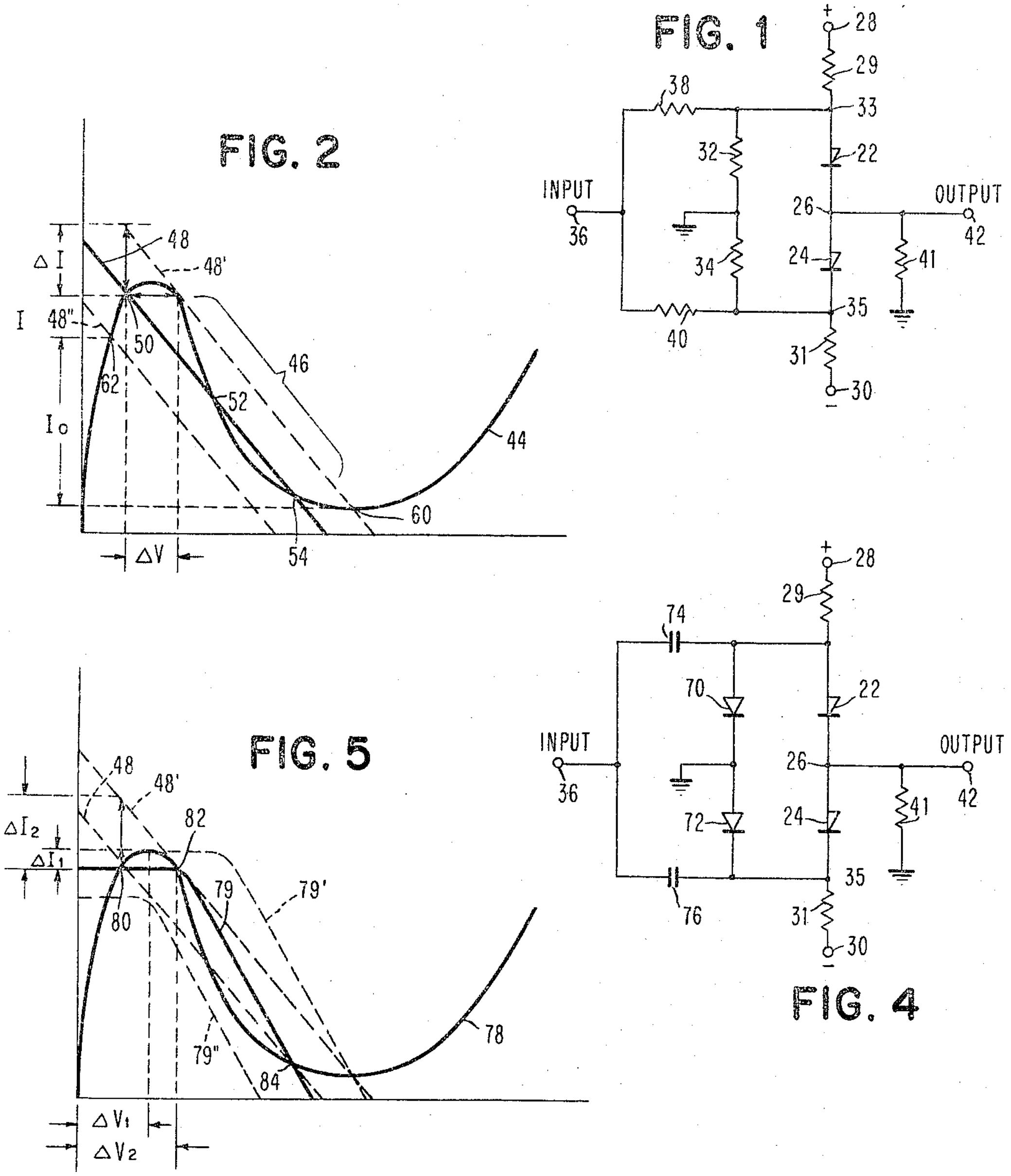
FIG. 1 is an electrical schematic of one embodiment of the present invention.
FIG. 2 is a voltage-current characteristic of a bistable semi-conductor device.
FIG. 4 is an electrical schematic of another embodiment of the present invention.
FIG. 5 is a voltage-characteristic of a bistable semi-conductor device employed in the electrical schematic shown in FIG. 4.

Referring to FIG. 1, an illustrative embodiment of the present invention includes a pair of bistable semi-conductor devices 22 and 24 connected at unlike ends thereof, to a common junction 26. Bistable semi-conductor devices are known to exist in several forms to a worker skilled in the art. One eminently satisfactory bistable semi-conductor device has been recently developed and may be advantageously employed in the present invention. This unique bistable semi-conductor device is described in an article entitled, "New Phenomenon in Narrow Germanium pn Junctions," Physical Review, vol. 109, 1958, pages 603 and 604, by L. Esaki. The device described in the previously mentioned publication is commonly referred to as a tunnel or Esaki diode. It should be understood of course, that there are other bistable semiconducting devices which may be employed in the present invention with satisfactory results. A tunnel diode has been selected as the preferred element for use in the present invention.

The tunnel diodes 22 and 24 employed in the present invention have matched characteristics and are connected in aiding series relation between equal and opposite unidirectional power sources 28 and 30, including resistors 29 and 31, respectively. The resistors 29 and 31 in conjunction with resistors 32 and 34, respectively bias the diodes 22 and 24, respectively, the resistors 32 and 34 being connected between a reference level, typically ground, and nodes or junctions 33 and 35, respectively.

An input circuit is connected across the diodes 22 and 24 and includes a terminal 36 connected to each of the junctions 33 and 35 through dropping resistors 38 and 40, respectively. Completing the circuit of the present invention is an output circuit connected to the junction 26 and including a terminal 42. A load 41 for the circuit is connected between the terminal 42 and the same reference point for that of the biasing resistors 32 and 34, typically ground.

As is shown in FIG. 2, the matched tunnel diodes have the same voltage-current characteristic 44, which, as can be seen, includes a negative resistance region 46. As is well known in the art, a load line 48, for the devices can be determined from voltages of the power supplies 28 and 30 and the resistors 29, 31, 32, 34, 38 and 40, the magnitudes of these parameters being chosen to permit the load line 48 to cross the curve 44 at one or more points where only one of the points is stable. In the present embodiment, the load line has been selected for reasons of convenience only to cross the curve at three points, 50, 52 and 54. An inspection of the characteristic curve will indicate that the point 50 is a stable operating point whereas the points 52 and 54 are unstable operating points, since the latter are in the negative resistance region of the diodes. For this type of load line, the tunnel diodes are said to be monostably biased.

Figure 3:
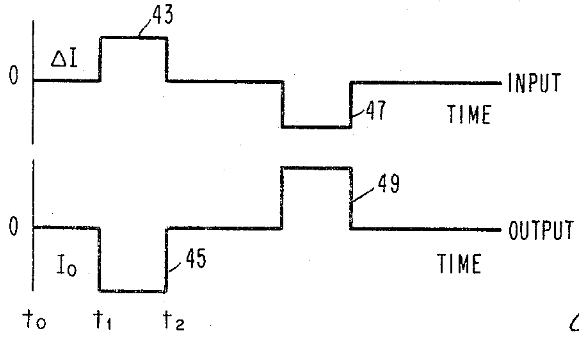
FIG. 3 is a diagram of input and output pulses to/from the electrical schematic shown in FIG. 1.

The power supply connections to the diodes are such as to bias both the diodes in the forward direction, and in the absence of an input signal to the terminal 36, the current arriving at the junction 26 from the diode 22 is substantially equal to the current being conducted away from the junction 26 by the diode 24. Hence as shown in FIG. 3, no current appears in the output circuit at time $t_0$. Similarly, the voltage at the junction 26 is at zero potential or ground reference since the voltage drops between the node 33 and the junction 26 and the node 35 and the junction 26 are equal and opposite.

With the application of an input signal to the input terminal 36, the load lines of the diodes, as is well known, will change in proportion to the magnitude and polarity of the input signal. For ease in explanation it is only necessary to describe in detail the operation of the diodes for pulses of one polarity since pulses of the opposite polarity produce the same result but in reverse.

Referring now to FIGS. 2 and 3, and assuming for purposes of convenience only, the application of a positive input pulse 43 to the terminal 36 at time $t_1$, the load line of the diode 22 will shift upwardly to a position 48' since the input current aids the biasing current supplied to the diode 22. In contrast, the load line of the diode 24 shifts downwardly to a position 48'' since the input current to the diode 24 opposes and subtracts from the current supplied by the biasing network and the source 30, the biasing network including resistors 31 and 34. If the magnitude of the positive input pulse exceeds the value $\Delta_I$, the diode 22 is switched to a stable operating point indicated at point 60. Simultaneously the load line of the diode 24 changes to produce a new stable operating point indicated at point 62. As can be seen from FIG. 2, the diode 22 is in the high voltage and low current or high impedance condition, whereas the diode 24 is in the conductive condition. Since one end of the diode 22 is fixed positively, the voltage at the junction 26 increases negatively and substantially equals that of the diode 22 at the operating point 60.

Since the diode 22 is in the high impedance condition, little or no current appears at the junction 26 from that diode, and the input current flows to the source 30 and the reference point. Current flows from the source 30 through the load 41 to the junction 26 returning to the source through the diode 24 and the resistor 31. A pulse 45, shown in FIG. 3, appears in the output circuit of the present invention and since both the input and output currents are flowing in to the network, the polarity of the output pulse is opposite to or the negative of the input pulse. The magnitude of the negative output pulse is equal to the difference between the currrents at the operating points 60 and 62. It can also be seen by inspection of FIG. 2 that the magnitude of the output current is relatively large as compared to the input current $\Delta I$. Also, the shape of the negative output pulse is substantially rectangular and is very little affected by the shape of the input pulse since a negative resistance device changes state almost instantaneously after the threshold is reached. This phenomenon is substantially faster than that which occurs in tubes and transistors.

After the input pulse 43 is removed at time $t_2$, the initial load line 48 of the diode is restored. Both the diodes 22 and 24 return to the operating point 50, the former diode first returning to operating point 54 which is in the unstable range of the device and thereafter returning to the operating point 50. As a consequence, the polarity inverter circuit of the present invention returns to the stable operating point without resetting as is required in many prior art devices.

For negative input pulses 47, the diode 24, for similar reasons indicated before, is placed in the high impedance condition and current 49 flows from the source 28 through the diode 22 returning to the source through the load 41. Since both the input and output currents flow into the network, the polarity of an output pulse 49 is the opposite or the positive reflection of the negative input pulse. Again the output current exceeds that of the input current and the pulse shape is substantially rectanglar. When the negative inpt pulse is removed, the output current is reduced to zero as the diode 24 is reset to the operating point 50. Hence, the present invention provides polarity inversion of an input signal about a reference level which may be of any value, but which for the present description has been selected as ground.

The present invention is also adapted to drive other circuits requiring signal inputs of greater voltage than that of the signals supplied to the present invention. As will be seen from FIG. 2 the input voltage is equal to $\Delta V$ whereas the output voltage is approximately that indicated for point 60, the output voltage by inspection being considerably greater in magnitude than that of $\Delta V$. Hence, polarity inversion and voltage gain permit the present invention to be advantageously employed in switching systems for more than one purpose thereby effecting cost savings in such systems.

Another embodiment of the present invention is shown in FIG. 4, wherein elements corresponding to those described in FIG. 1 have like reference designations. As can be seen from FIG. 4, a pair of asymmetrical semiconductor diodes 70 and 72 has been substituted for the resistors, 32 and 34, of FIG. 1. Also capacitors 74 and 76 are shown as being substituted for the resistors 38 and 40.

In accordance with well known circuit techniques, a load line 79 can be constructed on the voltage-current characteristic 78 of the diodes, shown in FIG. 5, to produce operating points 80, 82 and 84 for the diodes. The operating point 80 is in the stable range, whereas, the operating points 82 and 84 are in the unstable or negative resistance region of the diodes as in the case of the embodiment described in FIG. 1.

Upon the application of an input pulse to the circuit of FIG. 4, the diodes 70 and 72 do not turn on until one of the diodes 22 and 24 switches, depending, of course, upon the polarity of the input pulse. A positive pulse, for example, shifts the load lines 79 to positions 79' and 79'' for the diodes 22 and 24, respectively. As can be seen from FIG. 5, the voltage $\Delta V_2$ required to turn on the diode 70 and 72 is greater than voltage $\Delta V_1$ required to switch the appropriate tunnel diode. Since the diodes 70 and 72 are not turned on before the appropriate tunnel diode switches substantially all of the input current is supplied to the appropriate tunnel diode. Previously, for the embodiment shown in FIG. 1, the resistors 32 and 34 which the diodes 70 and 72 replaced, drew a portion of the input current and hence, the circuit of FIG. 1 required a greater power input to obtain the same result as that for the circuit shown in FIG. 4. This can be further illustrated by superimposing on FIG. 5 the load lines 48 and 48' of FIG. 2, corresponding to the no input signal and positive input signal conditions of the circuit, respectively. The current required by the resistors 32 and 34 before switching of the appropriate tunnel diodes is $\Delta I_2$, whereas, the current required by the diodes 70 and 72 is $\Delta I_1$. By inspection, it can be seen that $\Delta I_1$ is less than $\Delta I_2$.

The power requirement of the present invention may be further reduced by the substitution of the capacitors 74 and 76 for the resistors 38 and 40 of FIG. 1. On the application of an input pulse, the capacitors 74 and 76 permit the conduction of current to the diodes 22 and 24 until the capacitors are charged. The current supplied to the diodes 22 and 24 during the charging period is sufficient to switch the appropriate diodes to another stable operating point, which is produced by suitably arranging the bias network of the diodes. After the capacitors charge, the input current ceases and no further power input is required. In the case of the resistors 38 and 40, which the capacitors 74 and 76 replace, input current flows during the entire pulse interval, and hence, more power input is required for the embodiment employing the resistors 38 and 40 than for the embodiment employing the capacitors 74 and 76.

Although the present invention has indicated uni-directional sources 28 and 30 for power, it should be understood that an alternating current supply may also be employed and will permit the same operation, as that previously described.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. An inverter circuit comprising at least two bistable semi-conductor devices connected in series power supply and impedance means connected to the bistable devices for biasing normally both of said devices into the same conducting condition and monostable operation, an input circuit connected across said bistable devices, and an output circuit connected between the bistable devices, said output circuit providing output signals of opposite polarity to any input pulses supplied to the devices.

2. An inverter circuit comprising at least two bistable semi-conductor devices connected in series and including a common junction, a power supply having at least two output leads of unlike polarity, impedance means, means interconnecting the power supplies, impedance means and bistable devices for biasing normally both devices into the same conducting conduction and monostable operation, a balanced input circuit coupled across said bistable devices, and an output circuit connected between said devices, said output circuit providing output signals of opposite polarity to any input pulses supplied to the devices.

3. An inverter circuit comprising at least two bistable semi-conductor devices connected in series aiding relation, a power supply having at least two output leads of unlike polarity, said serially connected bistable devices being connected between at least two of the output leads for conduction of current therebetween, biasing means connected between a reference point and each output lead, said biasing means adapted to bias normally the bistable devices into the same conducting condition and a monostable operating condition, an input circuit connected across the bistable devices, and an output circuit connected to the junction between the serially connected bistable devices and the reference point.

4. An inverter circuit comprising at least two tunnel diodes connected in series aiding relation, a power supply having at least two output leads of unlike polarity, said series connected tunnel diodes being connected between output leads of unlike polarity for conduction of current therebetween, at least two non-linear resistors in series, said non-linear resistors being connected across the tunnel diodes and having a junction therebetween connected to a reference point, an input circuit connected across the non-linear resistors, and an output circuit connected to the tunnel diodes for polarity reversal about the reference point of any input pulses supplied to the devices.

5. The inverter circuit as described in claim 4 wherein the non-linear resistors are asymmetrical semi-conductor devices connected in series aiding relation.

6. An inverter circuit comprising at least two tunnel diodes connected in series aiding relation, a power supply having at least two output leads of unlike polarity, said serially connected tunnel diodes being connected between two output leads of unlike polarity for current conduction therebetween, non-linear impedance elements connected across the diodes for biasing thereof into the same conducting condition and a monostable operating condition, an input circuit including means for applying input signals directly to each tunnel diode, and an output circuit connected between said tunnel diodes, said output circuit providing output signals of opposite polarity to any input signal applied to the tunnel diodes.

7. The inverter circuit as described in claim 6 wherein the means for applying input signals directly to the tunnel diodes comprises reactive means connected between the input signal and the junction between each output lead and the tunnel diode connected thereto.

8. A switching circuit comprising first and second bistable devices connected in series, power supply and impedance means connected to each device to normally bias both devices in the same conducing condition, an input circuit connected across the devices and an output circuit connected between the devices, whereby an input signal of any polarity switching one device to a substantially lesser conducting condition than the other device and producing a signal in the output circuit of opposite polarity to the input signal.

9. The switching circuit defined in claim 8, wherein the output signal has a larger magnitude than that of the input signal.

10. A switching circuit comprising first and second bistable devices connected in series aiding relation, power supply and impedance means connected to each device to normally bias both devices in a low voltage, high current condition, an input circuit connected across the devices, and an output circuit connected between the devices, whereby a positive input pulse switching the first bistable device to a high voltage, low current condition while the second bistable device remains at the high current, low voltage condition thereby producing a negative signal in the output circuit and a negative input pulse switching the second bistable device to a high voltage, low current condition while the first bistable device remains at the low voltage, high current condition thereby providing a positive signal in the output circuit.

11. The switching circuit defined in claim 10 wherein the release of the input signal returns the switched bistable device to the low voltage, high current condition from the high voltage, low current condition.

12. An inverter comprising, in combination, two terminals across which an operating voltage may be applied; a first impedance element, first and second tunnel diodes, and a second impedance element, connected one to the other, in the order named, between said terminals, with the anode of the first tunnel diode connected to the cathode of the second tunnel diode; a pair of output signal terminals, one at the anode-to-cathode connection of the two tunnel diodes and the other at a point of reference voltage; a resistor voltage divider connected between the cathode of the first tunnel diode and the anode of the second tunnel diode; and a pair of input signal terminals, one at a point along the voltage divider and the other at said point of reference voltage.

13. In combination, first and second voltage controlled negative resistance elements, the first connected at its anode to the cathode of the second;

first and second resistors, one connected to the cathode of the first negative resistance element and the other connected to the anode of the second negative resistance element;

a balanced power supply connected across the circuit comprising the first and second negative resistance elements and first and second resistors for applying operating voltages in the forward direction through the resistors to the negative resistance elements at a level such that one of the elements can assume its high voltage state and the other its low voltage state;

a resistor voltage divider connected between the connection of one element to its resistor and the connection of the other element to its resistor;

a first pair of signal terminals, one said terminal at a point on said divider and the other said terminal at ground; and a second pair of signal terminals, one terminal at the anode-to-cathode connection of the negative resistance elements and the other terminal of the second pair at ground.

14. In combination, two terminals across which an operating voltage may be applied;

a first impedance element, first and second tunnel diodes, and a second impedance element, connected one to the other, in the order named, between said terminals, with the anode of the first tunnel diode connected to the cathode of the second tunnel diode;

a first pair of signal terminals, one at the anode-to-cathode connection of the two tunnel diodes and the other at a point of reference voltage;

an impedance network connected betwen the cathode of the first tunnel diode and the anode of the second tunnel diode; and a second pair of signal terminals, one at said impedance network and the other at said point of reference voltage.

15. In combination, two terminals across which an operating voltage may be applied;

a first impedance element, first and second tunnel diodes, and a second impedance element, connected one to the other, in the order named, between said terminals, with the anode of the first tunnel diode connected to the cathode of the second tunnel diode;

a first pair of signal terminals, one at the anode-to-cathode connection of the two tunnel diodes and the other at a point of reference voltage;

an impedance voltage divider connected between the cathode of the first tunnel diode and the anode of the second tunnel diode; and a second pair of signal terminals, one at substantially the midpoint of the impedance voltage divider and the other at said point of reference voltage.

References Cited

Electronics, "Tunnel Diode: Big Impact?" p. 61, 8–7–1959.

Pub. I, Chow, W. F. "Tunnel Diode Logic Circuits" Electronics, June 24, 1960, p. 106 relied on.

ARTHUR GAUSS, *Primary Examiner.*

HERMAN KARL SAALBACH, *Examiner.*

J. JORDAN, *Assistant Examiner.*